United States Patent
Lim et al.

[11] Patent Number: 6,020,221
[45] Date of Patent: Feb. 1, 2000

[54] PROCESS FOR MANUFACTURING A SEMICONDUCTOR DEVICE HAVING A STIFFENER MEMBER

[75] Inventors: Sengsooi Lim, San Jose; Ramaswamy Ranganathan, Cupertino; Sunil A. Patel, Santa Clara, all of Calif.

[73] Assignee: LSI Logic Corporation, Milpitas, Calif.

[21] Appl. No.: 08/764,039

[22] Filed: Dec. 12, 1996

[51] Int. Cl.[7] .......................... H01L 21/52; H01L 21/58; H01L 21/60

[52] U.S. Cl. .................................................. 438/125

[58] Field of Search .................. 438/125, FOR 375, 438/FOR 378, FOR 436; 257/730

[56] References Cited

U.S. PATENT DOCUMENTS

| | | |
|---|---|---|
| 4,146,896 | 3/1979 | Baril et al. . |
| 4,839,712 | 6/1989 | Mamodaly et al. . |
| 4,867,120 | 9/1989 | Belke et al. . |
| 5,278,724 | 1/1994 | Angulas et al. . |
| 5,350,945 | 9/1994 | Hayakawa . |
| 5,394,009 | 2/1995 | Loo . |
| 5,409,865 | 4/1995 | Karnezos . |
| 5,420,460 | 5/1995 | Massingill . |
| 5,477,082 | 12/1995 | Buckley, III et al. . |
| 5,644,163 | 7/1997 | Tsuji . |
| 5,730,620 | 3/1998 | Chan et al. . |
| 5,744,863 | 4/1998 | Cunane et al. . |

*Primary Examiner*—David E. Graybill

[57] ABSTRACT

The subject method comprises providing a semiconductor package and a semiconductor package substrate having respective first and second major sides. A stiffener member, which is attachable to the semiconductor package substrate, is employed for purposes of minimizing package warpage. The stiffener member is attached to the semiconductor package substrate to provide the requisite support for the semiconductor package substrate during the assembly process and thereby counteract the sources of the package warpage problem. A protective outer layer can be optionally added to the subject system.

9 Claims, 1 Drawing Sheet

PROCESS FOR MANUFACTURING A SEMICONDUCTOR DEVICE HAVING A STIFFENER MEMBER

BACKGROUND OF THE INVENTION

This invention generally relates to IC manufacture and assembly, and in particular to methods of producing semiconductor packages which are interconnectably mounted on underlying semiconductor package substrates.

Chip package interconnect systems are used by the semiconductor industry in the production of IC devices. Wire bonding and Tape Automated Bonding (TAB) are the most common chip interconnect methods used in the industry. However, the problems confronting wire bonding and TAB are becoming more apparent. Demands for increased I/O and electrical performance within smaller, denser chips are pushing wire bond and TAB to their performance, quality and manufacturing limits. Essentially, these technologies have reach their apex and further investment is based on diminishing returns to the user. A major emerging market segment today are flip-chip packages interconnectably mounted on various kinds of underlying substrates. Flip-chip technology has been implemented industry-wide because it has been found to be more than a chip interconnect system. It also provides much of the semiconductor package functions including electrical connection, thermal dissipation, mechanical support and reliability enhancement.

A number of standard interconnect packages may be used with flip-chips for single-chip modules (SCM) and, with package modifications, multi-chip modules (MCM). Some of these standard packages include the following: Ball Grid Arrays (BGA), either Plastic Ball Grid Arrays (PBGA) or Ceramic Ball Grid Arrays (CBGA), Pin Grid Arrays (PGA) and Ceramic Quad Flat Packs (CQFP). A discussion of newer interconnection technologies, such as BGA, PGA and the like, is set forth in commonly owned U.S. Pat. No. 5,381,848, which is incorporated herein by reference.

BGA's typically comprise a pattern of electrically conductive traces printed, plated or deposited onto a semiconductor package substrate ceramic or laminated PC board substrate. These BGA conductive traces branch out into an array pattern on the semiconductor package substrate surface. A semiconductor die is then mounted onto one side of the substrate and is electrically connected to these conductive traces. The BGA array pattern can be on the same side of the substrate where the semiconductor die is mounted, or on the opposite side, or on both sides.

Solder balls, which can be any one of a number of conductive alloys, are reflow soldered to the end of the conductive traces or "pads" in the array pattern. The solder balls provide the means for electrically connecting the conductive traces to the system in which it functions. Several methods are currently used to mount the solder balls onto the BGA package substrate. In one such method, soldering flux is applied to the package pads, after which a fixturing device or pickup and placement head is used to place the preformed solder balls, individually or en mass, onto the pads. The package is then heated to the melting point of the solder alloy, which then wets and bonds to the package pads.

Another method uses a printing or dispensing fixture or process to apply measured quantities of solder paste, a mixture of fine solder particles in a paste flux vehicle, onto the package contact pads. The paste can be melted by itself to form the ball contacts, or, by placing preformed solder balls into the solder paste, used to attach the preformed solder balls to the package pads. In either case, these soldering methods, and others, require a flux to achieve a satisfactory wetting of the surface by the molten solder.

During IC assembly process, flip-chip packages on laminate structures undergo "package warpage" due in great part to the heat generated during that process. In package warping, the flat surfaces of the laminate structures become undulated causing die cracks and open joints to be formed. This is a particular problem with new laminate materials which have an even thinner structural form and exhibit this package warpage problem to an even greater extent. Typically, package warpage occurs during the flip chip reflow process, the underfill epoxy cure process, and the BGA attachment process, when thermal energy is generated but the heat produced thereby is not successfully dissipated.

Therefore a need exists for providing a system and a method for producing semiconductor packages which are interconnectably mounted on underlying substrates wherein the above-described package warpage problem has been substantially minimized.

SUMMARY OF THE INVENTION

The subject invention overcomes the above-described package warpage problem and is directed to a system and a method for producing semiconductor packages which are interconnectably mounted on underlying substrates having a substantially increased package reliability and which minimizes package warpage during the package assembly process.

This invention relates to a method and system for producing a semiconductor package interconnectably mounted on a semiconductor package substrate without substantial package warpage, and to a method for using a stiffener member to reliably overcome such substantial package warpage. The subject method comprises providing a semiconductor package and a semiconductor package substrate having respective first and second major sides. A stiffener member, which is attachable to the semiconductor package substrate, is employed for purposes of minimizing package warpage. The stiffener member is attached to the semiconductor package substrate to provide the requisite support for the semiconductor package substrate during the assembly process and thereby counteract the sources of the package warpage problem.

The stiffener member preferably comprises a rigid, flat, rectangular structure having opening within the confines of the stiffener which defines an enclosed compartment. The semiconductor package substrate is located within the confines of the enclosed compartment. The enclosed compartment of the stiffener member preferably comprises an arcuate configuration, or a circular configuration, or a rectangular inner border having a plurality of tabs connected to the inner border and extending inwardly therefrom. In this latter case, the rectangular inner border, which defines four inner corners, preferably comprises a plurality of tabs which are connected to and extend inwardly from inner corners. In any of the above-described structural configurations, the enclosed compartment is preferably in as close a proximity to the semiconductor package as possible without affecting the operation of the semiconductor package.

Although the stiffener member can be constructed of any material which has a degree of rigidity capable of preventing package warping, and a coefficient of thermal expansion similar to the semiconductor package substrate so that it will permit heat generated during the assembly process to be dissipated, the stiffener member will typically comprises any one of a metallic, ceramic or polymeric material. The coefficient of thermal expansion is typically measured by the DuPont 943 Thermal Mechanical Analyzer for −50 degrees C. to 250 degrees C. The Analyzer measures the variation in length of a sample, such as Ryton®, with the change in temperature, and the results are reported as μm per meter of sample per degree C. (μm/m/degree C.). For example, if Ryton® R-10, a polyphenylene sulfide glass and mineral filler material manufactured by DuPont®, is employed to produce the semiconductor package substrate, the coefficient of linear expansion is 17 μm/m/degree C. in the axial direction, and 22 μm/m/degree C. in the transverse direction. It is preferred that the coefficient of thermal expansion of the stiffener member and substrate, respectively, preferably be within about 30%, and more preferably be within about 20%, and most preferably be within about 10% of each other for the reasons set forth above. If a protective cover is employed over the stiffener member and substrate, respectively, it will also preferably exhibit a similar coefficient of thermal expansion to that which is described above for stiffener member and substrate.

In one stage of the IC assembly, an interconnect array package is applied on the second major side of the semiconductor package substrate, and/or in another stage of IC assembly, the semiconductor package is electrically and mechanically interconnectably mounted to the first major side of the semiconductor package substrate, an amount of heat typically generated during either or both stages which is sufficient to cause substantial semiconductor package warpage. In either or both cases, the stiffener member substantially reduces semiconductor package warpage which would interfere with the effective operation of the semiconductor package. Thus, the stiffener member of the present invention can act as a single-stage or multi-stage stiffener member to prevent the above-described semiconductor package warpage.

The semiconductor package, which is preferably a flip chip package, is then interconnectably mechanically and electrically mounted to the first major side of the semiconductor package substrate. This can be accomplished by a number of methods but is preferably facilitated employing an interconnect array package, preferably a Ball Grid Array. In general, solder bumps are connected to one of the major surfaces of the semiconductor package. The process of producing and connecting solder bumps to the semiconductor package is described in Chapter 6 of a text entitled *Microelectronics Packaging Handbook,* published by Van Nostrand Reinhold (1989) at pages 366–391, that text being incorporated by reference herein. More specifically, the solder bumps are deposited on the surface of the semiconductor package, aligned to the substrates corresponding metal pads, and reflowed at high temperature to form the requisite electrical and mechanical connections. The heat from the reflow step is sufficient to cause package warpage. A liquid underfill is also employed between the semiconductor package and the substrate. When this underfill is cured, the heat generated is also sufficient to cause package warpage.

Then, an interconnect array package, which is also preferably a Ball Grid Array, is applied on the second major side of the semiconductor package substrate. Typically, an amount of heat is generated during the application step which is sufficient to cause substantial semiconductor package warpage. Again, the stiffener member prevents substantial semiconductor package warpage which would interfere with the effective operation of the semiconductor package.

The foregoing and other objects, features and advantages of the invention will become more readily apparent from the following detailed description of a preferred embodiment of the invention which proceeds with reference to the accompanying drawings.

DETAILED DESCRIPTION OF A PREFERRED EMBODIMENT

Figure 2:
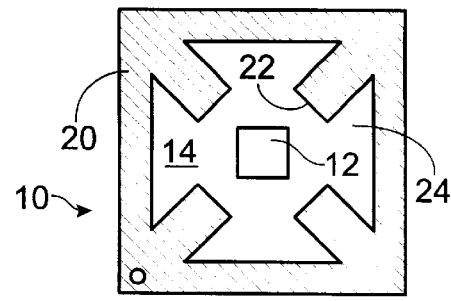
FIG. 2 is a plan view of an IC assembly of the present invention including a stiffener member 20 comprising a rectangular inner border having a plurality of rectangular tabs connected to the respective inner corners thereof and extending inwardly therefrom.

Turning now to FIG. 2, an IC assembly 10 comprises a semiconductor flip chip package or die 12 and a semiconductor flip chip package substrate 14. A stiffener member 20 is attached to a major surface of substrate 14. Typically, this is accomplished by dispensing an epoxy resin on top of the substrate 14, or a preformed epoxy material can be placed on the substrate. Stiffener member 20 is then placed on top of the epoxy resin and substrate 14. By applying heat and pressure to the composite structure, the epoxy resin is cured, and bonding between the stiffener member 20 and the substrate 14 will be effected.

Figure 1:
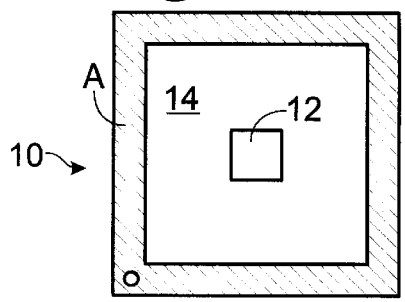
FIG. 1 is a plan view of a prior art stiffener member A comprising a rectangular inner border.

FIG. 1 shows a prior art stiffener member "A", in the form of a picture frame stiffener, which is adhered to a substrate 14. As described in Example 1 below, this structural stiffener member A does not provide adequate support underneath the die 12 region during the reflow process, as well as during the underfill process. This results in package warpage and hence reliability failure of the IC assembly 10.

The stiffener members of this invention, the preferred configurations of which are shown in FIGS. 2–7, generally comprise a rigid, flat, rectangular outer structure, having a central cut-out portion 22–22e defining a compartment 24–24e therewithin. The use of the stiffener members 20–20e provide the requisite support underneath the die 12 region during the reflow process, as well as during the underfill process. This results in avoidance of the package warpage problem and hence improved reliability of the IC assembly.

Figure 3:
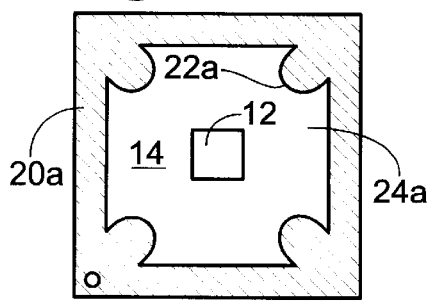
FIG. 3 is a plan view of an IC assembly of the present invention including a stiffener member 20a comprising a rectangular inner border having a plurality of rectangular tabs 20a connected to the respective inner corners thereof and extending inwardly therefrom, each of the tabs 20a comprising non-parallel sides and a rounded outer end.
Figure 4:
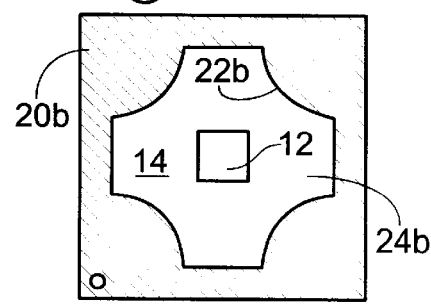
FIG. 4 is a plan view of an IC assembly of the present invention including a stiffener member 20b comprising a central cut-out portion which preferably comprises a plurality of tabs 22b each having parallel sides and a notched end portion.
Figure 5:
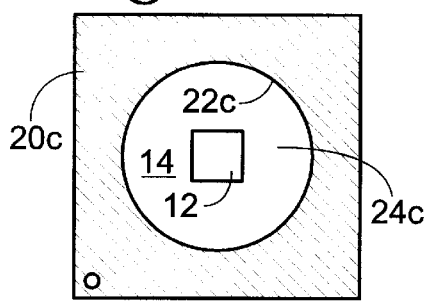
FIG. 5 is a plan view of an IC assembly of the present invention including a stiffener member 20c comprising a central cut-out portion 22c preferably comprises an outwardly-extending arcuate configuration.
Figure 6:
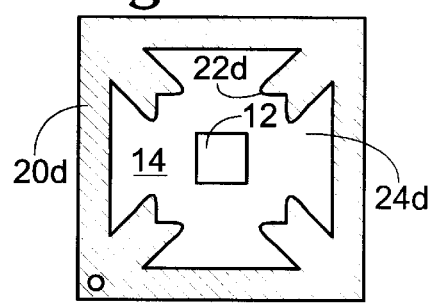
FIG. 6 is a plan view of an IC assembly of the present invention including a stiffener member 20d having a circular configuration.
Figure 7:
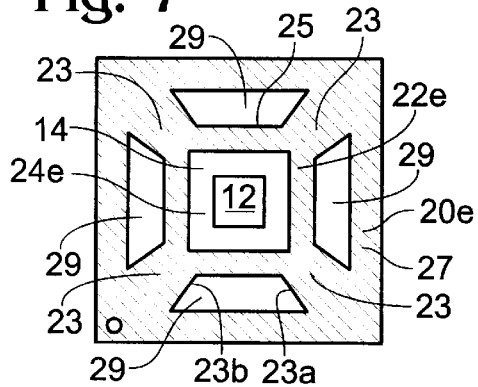
FIG. 7 is a plan view of an IC assembly of the present invention including a stiffener member 20e comprising respective inner and an outer rectangular frames connected to each other.

The compartments 24–24e are designed so that semiconductor package 12 can be located within the confines thereof. The central cut-out portion 22–22e preferably comprises an inwardly-extending or outwardly-extending arcuate configuration (see FIGS. 4 and 5), or a circular configuration (see FIG. 6), or a rectangular inner border having a plurality of tabs connected to the corners or sides thereof and extending inwardly therefrom (see FIGS. 2–4). In FIG. 2, the tabs 22 each have an elongate rectangular shape. In FIG. 3, the tabs 22a each have non-parallel, inwardly-extending sides and a rounded outer end. In FIG. 4, the tabs 22b comprise each have substantially parallel sides and a notched outer end. In FIG. 7, an inner rectangular member 25 is attached by tabs 23 to its outer corners and to the inner corners of outer rectangular member 27. Tabs 23 have non-parallel sides 23a and 23b. Inner and outer rectangular members 25 and 27, and tabs 23, together define trapezoidally-shaped slots 29.

In any of these structural configurations, the compartment 24 is preferably in close proximity to the semiconductor package 12. The stiffener member 20 can be stamped from a metallic material, for example, copper or aluminum, or formed or molded from a polymeric material, such as Ryton®, as previously described herein, or formed of a ceramic material, such as $Al_2O_3$.

Semiconductor flip chip package 14 has solder bumps 30, typically utilizing 97/3 Pb/Sn, which are deposited on wettable metal terminals (not shown) populating active major surface 18. The bumps 30 are aligned to the corresponding metal pads 40 of the semiconductor flip chip package substrate 14.

Figure 8:
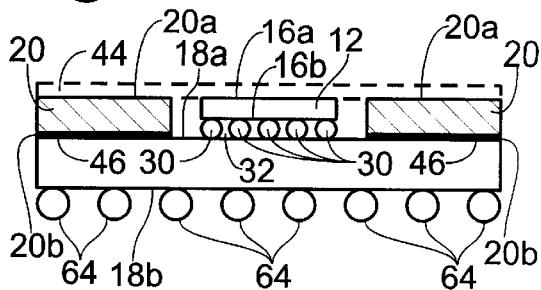
FIG. 8 is a sectional view of the IC assembly 10 with or without an optional protective cover layer 44.

As shown in FIG. 8, in order to join the second major surface 16b of package 12 to the first major surface 18a of substrate 14, the solder bumps 30 on surface 16b and the solder bumps 64 on surface 18b are reflowed at high temperature (up to 365 degrees C.) to simultaneously form electrical and mechanical connections. The surface tension of the molten solder 30 self-aligns the semiconductor flip chip package 12 to the substrate 14 making the IC assembly 10 extremely robust. A liquid underfill 32 can be dispensed and cured to enhance reliability. These respective reflow and underfill processes will cause package warpage to substrate 14.

The lower major surface 20b of stiffener member 20 is joined to the upper major surface 18a of substrate 14 by adhesive material 46, typically an epoxy resin adhesive material. An additional optional outer protective layer 44 can also be joined to the upper major surface 20a of stiffener member 20 and to the upper major surface 16a of the subject IC assembly 10 by adhesive material 46. The outer protective layer 44 can be fabricated of a metallic composition such as copper or aluminum. Preferably, a conventional thermal grease can be included with the adhesive material 46 at the point where the outer protective layer 44 is joined to the upper surface 16a.

The substrate 14 must be able to withstand high temperature processing. A ceramic, such as $Al_2O_3$, is the most common substrate material. Other substrate materials of construction include PTFE (Teflon®), Polyamide Tape, BT-FR4 and BT-FR5.

The substrate can also have metal pads or top surface metal (not shown). The size, construction and uniformity of such pads can lead to forming consistent, reliable and reworkable (if necessary) interconnections. Substrate construction varies from thin film single layers to complex thick film multi-layer versions. These are available in a single chip and multi-chip BGA and QFP packages.

Having described and illustrated the principles the invention in a preferred embodiment thereof, it should be apparent that the invention can be modified in arrangement and detail without departing from such principles. We claim all modifications and variations coming within the spirit and scope of the following claims.

We claim:

1. A method for producing a semiconductor package interconnectably mounted on a semiconductor package substrate without substantial package warpage, comprising the steps of:

a. providing a semiconductor package and a semiconductor package substrate having first and second major sides, the substrate having a substantially rectangular outer shape, the rectangular outer shape defining a diagonal axis;

b. providing a stiffener member which is attachable to said semiconductor package substrate, the stiffener having a mass (M) and being shaped such that the moment of inertia about the diagonal axis of the stiffener has a smaller value than the moment of inertia about the diagonal axis of a structure having mass M, a substantially rectangular outer shape, and a rectangular cut-out portion;

c. attaching said stiffener member to said semiconductor package substrate;

d. interconnectably mounting said semiconductor package to said first major side of said semiconductor package substrate; and e. applying an interconnect array package on said second major side of said semiconductor package substrate.

2. The method of claim 1, wherein said interconnect array package comprises a Ball Grid Array.

3. The method of claim 1, wherein said stiffener defines an enclosed compartment that comprises an arcuate configuration.

4. The method of claim 1, wherein said stiffener defines an enclosed compartment that comprises a circular configuration.

5. The method of claim 1, wherein said stiffener member comprises a metal, ceramic or polymeric material.

6. The method of claim 1, wherein said semiconductor package comprises a flip chip package.

7. A method for producing a semiconductor package interconnectably mounted on a semiconductor package substrate without substantial package warpage, comprising the steps of:

a. providing a semiconductor package and a semiconductor package substrate having first and second major sides, the substrate having a substantially rectangular outer shape, the substantially rectangular outer shape having a center, a diagonal axis and quadrants defined by two perpendicular lines passing through the center;

b. providing a stiffener member which is attachable to said semiconductor package substrate the stiffener having a surface having an area A;

c. attaching said surface of said stiffener member to said semiconductor package substrate such that the integral of r(x) over one of the quadrants of the substrate, where r(x) is the distance from a point x on said surface to the diagonal axis, is less than the corresponding integral for a different surface having area A and shaped in the form of a rectangle with a rectangular cut-out portion;

d. interconnectably mounting said semiconductor package to said first major side of said semiconductor package substrate; and e. applying an interconnect array package on said second major side of said semiconductor package substrate.

8. The method of claim 7 wherein said surface of said stiffener comprises a rectangular outer perimeter and an inner perimeter defined by at least one tab like surface lying in part along said diagonal axis.

9. The method of claim 8 wherein said surface of said stiffener comprises a rectangle with a circular cut-out portion.

* * * * *